(12) United States Patent
Huang et al.

(10) Patent No.: US 8,547,259 B1
(45) Date of Patent: Oct. 1, 2013

(54) BUFFER OFFSET MODULATION

(75) Inventors: Jui-Cheng Huang, Hsin-Chu (TW);
Mei-Chen Chuang, Pingtung (TW);
Ying-Chih Hsu, Taichung (TW); Chia Liang Tai, Taichung (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/562,509

(22) Filed: Jul. 31, 2012

(51) Int. Cl.
*H03M 1/06* (2006.01)

(52) U.S. Cl.
USPC ............................. 341/118; 341/143; 341/155

(58) Field of Classification Search
USPC .................................................. 341/118, 143
See application file for complete search history.

(56) References Cited

U.S. PATENT DOCUMENTS

| 7,391,351 | B2 * | 6/2008 | Pertijs et al. | ................... | 341/143 |
| 7,538,705 | B2 * | 5/2009 | Deval et al. | ................... | 341/143 |

OTHER PUBLICATIONS

"Operational Amplifier", Retrieved Jun. 21, 2012, pp. 1-22, http://en.wikipedia.org/wiki/Operational_amplifier.

* cited by examiner

*Primary Examiner* — Khai M Nguyen
(74) *Attorney, Agent, or Firm* — Cooper Legal Group LLC

(57) ABSTRACT

One or more techniques for buffer offset modulation or buffer offset cancelling are provided herein. In an embodiment, an output for a sigma-delta analog digital converter (ADC) is provided using an output of a first chop-able buffer (FB) and an output of a second chop-able buffer (SB). For example, the output of the FB is associated with a first offset, the output of the SB is associated with a second offset, and the output of the ADC includes an ADC offset associated with the first offset and the second offset. In an embodiment, buffer offset modulation is provided by modulating the ADC offset using an offset rotation. In an example, the offset rotation is based at least in part on a reference clock and the output of the ADC. The buffer offset modulation mitigates the first offset or the second offset, where such offsets are generally undesired.

20 Claims, 8 Drawing Sheets

| ROTATE CONTROL 412, 144, 146 | INPUT VOLTAGE 402 | BUFFER OFFSET 406 | CHOP-ABLE BUFFER OUTPUT 408 |
|---|---|---|---|
| 0 | Vin | Vos | Vin - Vos |
| 1 | Vin | Vos | Vin + Vos |

| ADC OUTPUT 132 (D) | REFERENCE VOLTAGE AT 520 OR 522 | REFERENCE VOLTAGE AT "D" 132 | CHANGE IN POLARITY |
|---|---|---|---|
| 0 | +(Vrp1 − Vrn1) | −(Vrp1 − Vrn1) | Yes |
| 1 | +(Vrp1 − Vrn1) | +(Vrp1 − Vrn1) | No |

| OFFSET ROTATE 142 (R) | ADC OUTPUT 132 (D) | OUTPUT 112 FOR FIRST BUFFER (FB) (Vrp1) | OUTPUT 122 FOR SECOND BUFFER (SB) (Vrn1) | REFERENCE VOLTAGE 520 (Vrp1 – Vrn1) | ADC OUTPUT "D" 132 | REFERENCE VOLTAGE AT OUTPUT "D" 132 | ADC OFFSET AT OUTPUT "D" 132 |
|---|---|---|---|---|---|---|---|
| 0 | 0 | Vrp – Vos1 | Vrn – Vos2 | (Vrp – Vrn) – (Vos1 – Vos2) | (Vrn – Vrp) + (Vos1 – Vos2) | (Vrn – Vrp) | +(Vos1 – Vos2) |
| 1 | 0 | Vrp + Vos1 | Vrn + Vos2 | (Vrp – Vrn) + (Vos1 – Vos2) | (Vrn – Vrp) – (Vos1 – Vos2) | (Vrn – Vrp) | –(Vos1 – Vos2) |
| 0 | 1 | Vrp – Vos1 | Vrn – Vos2 | (Vrp – Vrn) – (Vos1 – Vos2) | (Vrp – Vrn) – (Vos1 – Vos2) | (Vrp – Vrn) | –(Vos1 – Vos2) |
| 1 | 1 | Vrp + Vos1 | Vrn + Vos2 | (Vrp – Vrn) + (Vos1 – Vos2) | (Vrp – Vrn) + (Vos1 – Vos2) | (Vrp – Vrn) | +(Vos1 – Vos2) |

BUFFER OFFSET MODULATION

BACKGROUND

Generally, a sigma-delta analog digital converter (ADC) runs at a high frequency and is associated with one or more reference buffers or buffers. For example, a reference voltage provided by a reference buffer is generally required for the sigma-delta ADC. Generally, a reference buffer comprises a buffer offset or offset, which is generally undesirable. In an example, the buffer offset impacts an ADC curve such that the ADC curve is different from a theoretical ADC curve. Implementing an increased buffer size or a switched capacitor for storing the buffer offset mitigates at least some of the buffer offset. However, an increased buffer size generally increases circuit area. In some examples, it is undesirable to increase circuit area according to design rules. Additionally, the switched capacitor requires a high driving input signal, additional power, large capacitors to store the buffer offset, and is thus difficult to implement.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques, circuits, or systems for buffer offset modulation or buffer offset cancelling are provided herein. In an embodiment, buffer offset modulation is enabled by calculating an output for a sigma-delta analog digital converter (ADC) based at least in part on an output of a first chop-able buffer (FB) and an output of a second chop-able buffer (SB). In an embodiment, the output of the FB is associated with a first offset, the output of the SB is associated with a second offset, and the output of the ADC comprises an ADC offset associated with the first offset and the second offset. In an embodiment, the ADC offset is modulated based at least in part on an offset rotation and the offset rotation is based at least in part on a reference clock and the output of the ADC. For example, a chop-able buffer comprises an operational amplifier comprising an input, a feedback loop, and a rotation control configured to rotate a polarity of an offset associated with the chop-able buffer based at least in part on an offset rotation. In an embodiment, the ADC is associated with a reference voltage comprising one or more buffer offsets or offsets and is configured to rotate a polarity of the reference voltage based at least in part the output of the ADC. Accordingly, the ADC rotates the polarity of buffer offsets in a manner different than the polarity rotation of the chop-able buffers. In an embodiment, the offset rotation enables the ADC to output a modulated offset by controlling the polarity rotation of the FB, the SB, and the ADC.

The following description and annexed drawings set forth certain illustrative aspects and implementations. These are indicative of but a few of various ways in which one or more aspects are employed. Other aspects, advantages, or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements or structures of the drawings are not necessarily be drawn to scale. Accordingly, the dimensions of the various features may be arbitrarily increased or reduced for clarity of discussion.

FIG. 6 is a truth table associated with an example of buffer offset modulation, according to an embodiment.

DETAILED DESCRIPTION

Figure 1:
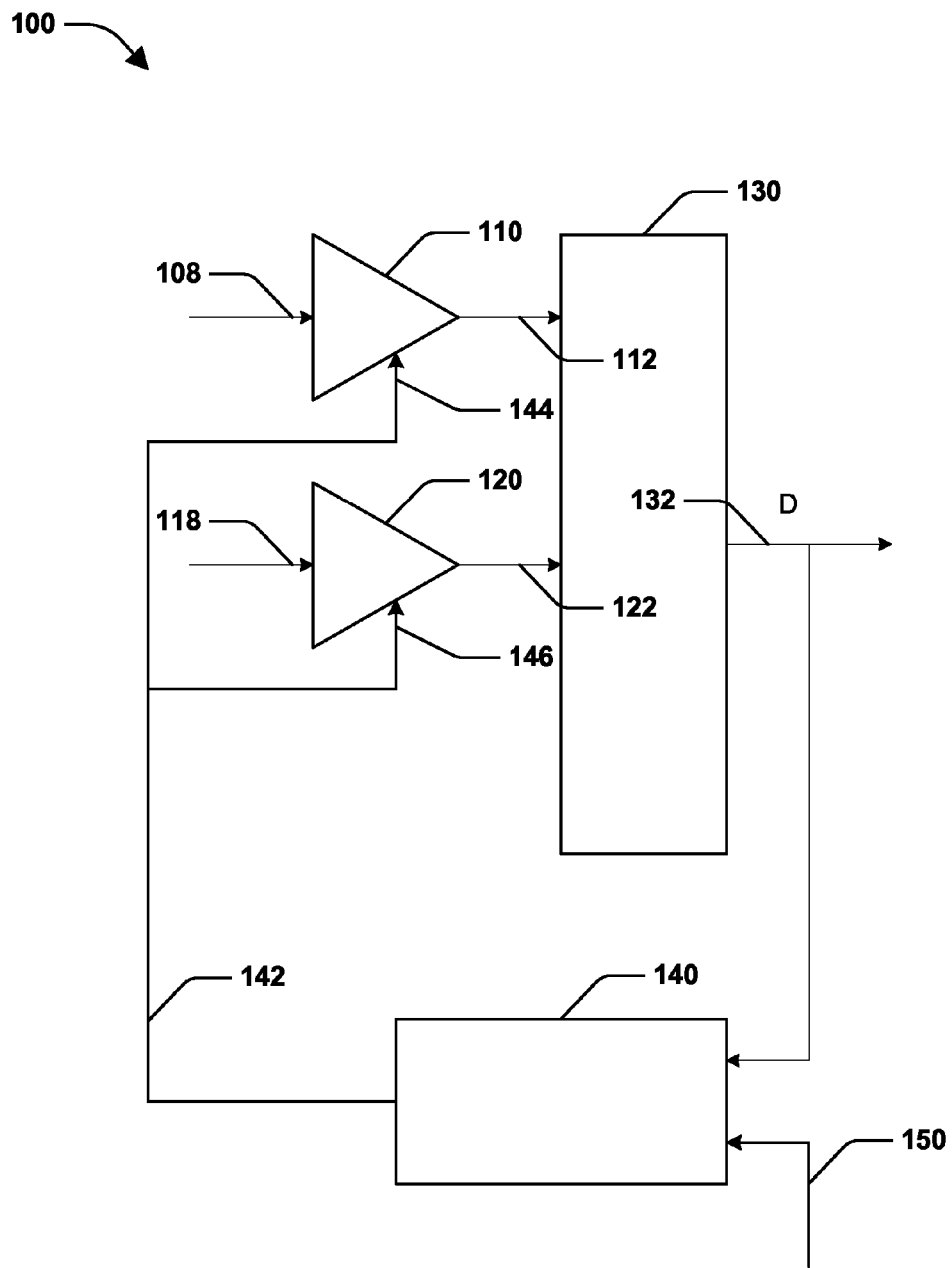
FIG. 1 is schematic diagram of an example circuit for buffer offset modulation, according to an embodiment.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

Generally, a reference buffer, chop-able buffer, or a buffer comprises an undesirable buffer offset or offset. In an embodiment, as provided herein, the undesirable offset is mitigated by modulating a polarity of the offset and filtering the offset from an output signal comprising the offset. According to an example, if the output is "D" and the offset is "Vos", a desired modulation comprises "D+Vos", "D−Vos", "D+Vos", "D−Vos", D+Vos", "D−Vos", etc. That is, the offset "Vos" is modulated such that the polarity of the offset switches back and forth from positive "+" to negative "−" rather quickly. The offset is mitigated or effectively removed by using a digital low-pass filter which filters out high frequency signals. For example, the offset is modulated at a frequency around 100 kHz to 10 MHz and the digital low-pass filter allows signals at frequency of 1 kHz to 100 kHz to pass through the digital low-pass filter, such that the high frequency offset is not allowed to pass through the low-pass filter. In an embodiment, buffer offset modulation comprises calculating an output for a sigma-delta analog digital converter (ADC) based at least in part on an output of a first chop-able buffer (FB) and an output of a second chop-able buffer (SB), the output of the FB associated with a first offset, the output of the SB associated with a second offset, the output of the ADC comprising an ADC offset associated with the first offset and the second offset. Additionally, the buffer offset modulation comprises modulating the ADC offset based at least in part on an offset rotation, the offset rotation based at least in part on a reference clock and the output of the ADC.

In an embodiment, a sigma-delta analog digital converter (ADC) runs at a high frequency and comprises a first input, a second input, an output comprising an ADC offset, an integrator, a quantizer, a comparator, and a resolution of "M" bits, and is connected to an input voltage (Vin), for example. In an embodiment, the sigma-delta ADC over-samples at a high frequency by comparison to a low frequency of a traditional analog digital converter. The ADC is configured to modulate the ADC offset based at least in part on an output of a first chop-able buffer (FB) and an output of a second chop-able buffer (SB). Additionally, the ADC comprises a closed loop, such as a feedback loop from a quantizer or an output ("D") of the ADC. According to an embodiment, the ADC is configured to rotate a polarity of a reference voltage associated with the output of the FB and the output of the SB based at least in part the output ("D") of the ADC. It will be appreciated that the output of the FB and the output of the SB are associated with a first offset and a second offset respectively. Therefore, the ADC rotates a polarity of the first offset voltage and the second offset voltage by rotating the polarity of the reference voltage. It will be appreciated that in other embodiments, the feedback loop comprises additional components, such as chop-able buffers, chopper control modules, or filters, for example.

In an embodiment, the first chop-able buffer (FB) and the second chop-able buffer (SB) comprise respective chop-able buffers. For example, a chop-able buffer comprises an operational amplifier comprising an input, a rotation control, a feedback signal or an output connected to a second input, and an offset associated with the output. In an embodiment, the rotation control is configured to rotate a polarity of the offset based at least in part an offset rotation by swapping the input signal and the feedback signal connected to inputs of the operational amplifier. For example, the offset rotation comprises an offset rotation signal derived from a chopper control module.

In an embodiment, the chopper control module comprises a control circuit comprising a first input, a second input, and an output. For example, the first input of the chopper control module is connected to a reference clock and the second input of the chopper control module is connected to the output ("D") of the ADC. Accordingly, the output of the chopper control module is configured to generate an offset rotation based at least in part on the reference clock and the output ("D") of the ADC. In an embodiment, the offset rotation is connected to or controls the rotation control of the first chop-able buffer and the rotation control of the second chop-able buffer. In an example, the reference clock is a predetermined clock sequence comprising a high frequency clock signal. In an embodiment, the reference clock enables modulation of an ADC offset at a corresponding high frequency.

In an embodiment, the modulated ADC offset is filtered by a low-pass filter, such as a low-pass digital filter associated with a frequency for allowing a range of low frequency signals through. In an embodiment, the high frequency clock signal of the reference clock comprises a frequency higher than the frequency associated with or allowed to pass through the low-pass filter. In this way, buffer offset modulation or buffer offset cancelling is provided.

FIG. 1 is schematic diagram of an example circuit 100 for buffer offset modulation, according to an embodiment. For example, buffer offset modulation circuit 100 comprises a first chop-able buffer (FB) 110, a second chop-able buffer (SB) 120, a sigma-delta analog digital converter (ADC) 130, and a chopper control module 140. In an embodiment, FB 110 is an operational amplifier comprising an input 108, a rotation control 144, and an output 112. Similarly, SB 120 is an operational amplifier comprising an input 118, a rotation control 146, and an output 122. It will be appreciated that in some embodiments the FB 110 and the SB 120 comprise feedback loops, to be described in more detail herein. Accordingly, the FB 110 is configured to generate the output 112 based at least in part on the input 108 and the rotation control 144. Additionally, SB 120 is configured to generate the output 122 based at least in part on the input 118 and the rotation control 146. In an embodiment, the output 112 of the FB 110 comprises a first offset (not shown) and the output 122 of the SB 120 comprises a second offset (not shown). In an embodiment, FB 110 or SB 120 are configured to respectively rotate a polarity of the first offset or the second offset based at least in part on an output of the chopper control module 140, such as offset rotate 142. Thus, it will be appreciated that the FB 110 and the SB 120 are configured to rotate an offset polarity for respective buffers.

In an example, the ADC 130 comprises a first input connected to the output 112 of the FB 110, a second input connected to the output 122 of the SB 120, and an output "D" 132. For example, output "D" 132 is generated based at least in part on the output 112 of the FB and the output 122 of the SB. In an embodiment, the output "D" 132 comprises an ADC offset (not shown) which is a function of the first offset associated with the output 112 of the FB and the second offset associated with the output 122 of the SB. According to an example, the ADC 130 determines a reference voltage by subtracting the output 122 of the SB 120 from the output 112 of the FB 110. However, in other embodiments, the reference voltage is calculated by subtracting the output 112 of the FB 110 from the output 122 of the SB 120. The reference voltage generally corresponds to what the ADC would output if the output 112 of the FB 110 did not comprise the first offset and if the output 122 of the SB 120 did not comprise the second offset. However, because the output 112 comprises the first offset and because the output 122 comprises the second offset, the output of the ADC comprises the ADC offset, in addition to the reference voltage. In an effort to mitigate the ADC offset, the ADC 130 is configured to rotate a polarity of the first offset and a polarity of the second offset. Therefore, a polarity of the ADC offset is rotated, at least because the ADC offset comprises the first offset and the second offset. Additionally, the ADC 130 is configured to rotate respective offset polarities based on a feedback loop. In this way, the ADC offset is filtered out, for example. It will be appreciated, however, that the rotation of the polarity of the first offset and the rotation of the polarity of the second offset using the offset rotate 142 is different than the rotation of the polarity of the first offset and the rotation of the polarity of the second offset performed by the ADC 130. That is, the respective polarities of the first offset and the second offset are rotated in a first manner using the offset rotate 142 and are rotated in a second manner using by the ADC 130.

In an embodiment, the chopper control module 140 comprises a first input connected to the output "D" 132 of the ADC and a second input connected to a reference clock 150. In an embodiment, the chopper control module 140 is configured to generate an offset rotate 142, such as an offset rotation signal. In an embodiment, the offset rotate 142 enables the ADC 130 to output a modulated ADC offset by compensating for the first manner of offset rotation of the FB 110 and the SB 120 and the second manner of offset rotation associated with the ADC 130. For example, the offset rotate 142 is an offset rotation signal configured to control offset polarities associated with the FB 110 and the SB 120 via rotation control 144 and rotation control 146, respectively. In an embodiment, an ADC offset is modulated at least because the offset rotate 142 from chopper control module 140 controls offset modulation of the FB 110 and the SB 120. Additionally, a reference voltage polarity of the ADC 130 is also controlled by offset rotate 142 at least because the output "D" 132 of the ADC forms a feedback loop through the chopper control module 140, the FB 110, and the SB 120. For example, since the reference voltage polarity rotation is based at least in part on the output "D" 132 of the ADC, the chopper control module 140 is configured to control the offset polarity rotation of the ADC by basing the output of the chopper control module 140 on the output "D" 132 of the ADC. Moreover, the output of the chopper control module 140 is connected to the ADC via the FB and the SB, thus enabling chopper control module 140 to compensate for the first manner of offset rotation associated with the FB and the SB and the second manner of offset rotation associated with the ADC.

In an example embodiment, the chopper control module 140 is configured to predetermine an output "D" 132 of the ADC and synchronize offset polarity rotation between the FB 110, the SB 120, and the ADC 130.

In an embodiment, reference clock 150 is associated with a modulation frequency of the ADC offset. For example, if a frequency of reference clock 150 is raised, the modulation frequency of the ADC offset is raised in a corresponding manner. That is, for example, a modulation frequency of the ADC offset is based at least in part on a frequency of the reference clock 150 at least because the offset rotate 142 is connected to and controls rotation control 144 and rotation control 146 of the FB and SB, respectively.

Figure 2:
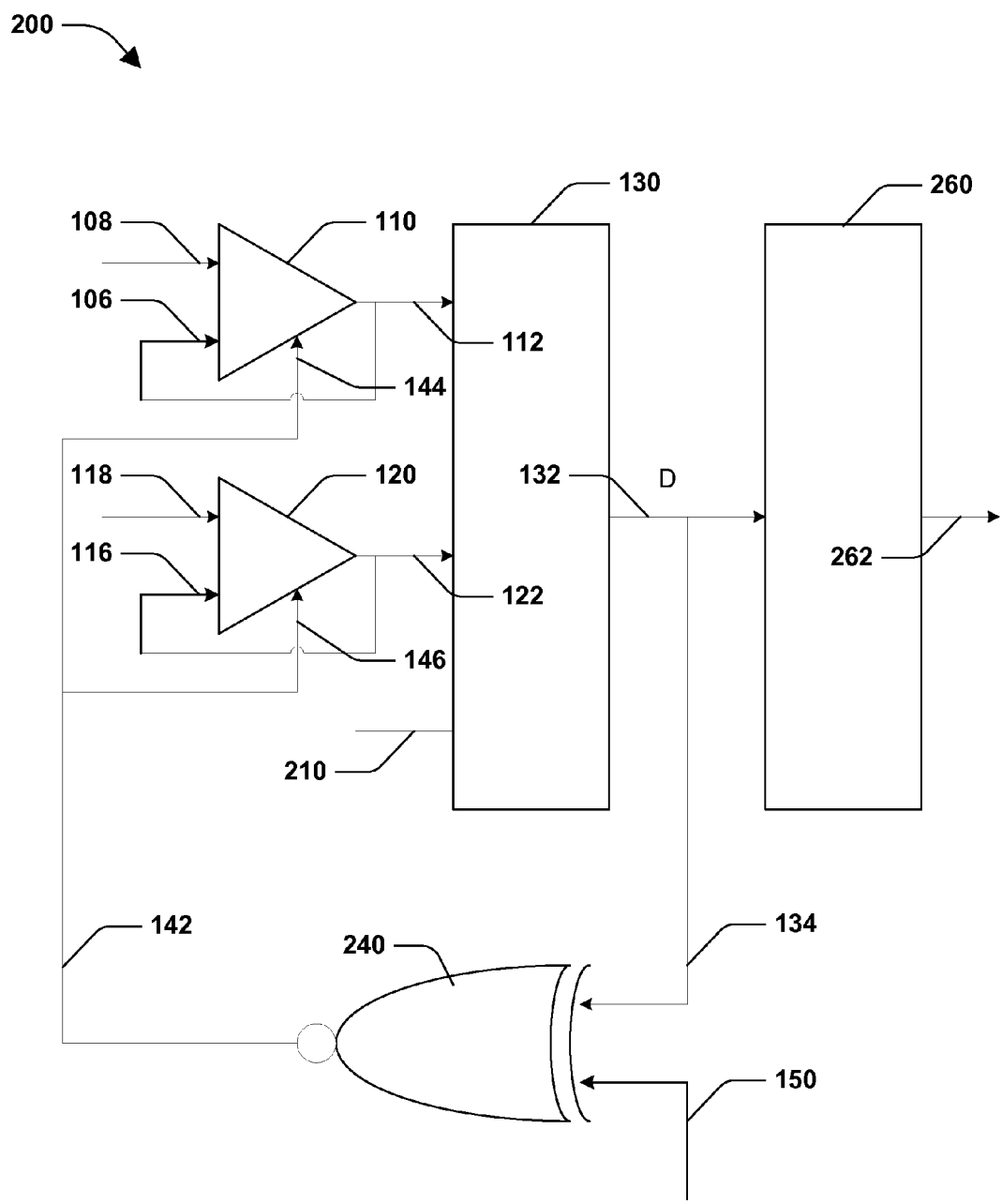
FIG. 2 is schematic diagram of an example circuit for buffer offset modulation, according to an embodiment.

FIG. 2 is schematic diagram of an example circuit 200 for buffer offset modulation, according to an embodiment. In an embodiment, buffer offset modulation circuit 200 comprises a first chop-able buffer (FB) 110, a second chop-able buffer (SB) 120, a sigma-delta analog digital converter (ADC) 130, chopper control module 240, and a digital low-pass filter 260. According to an aspect, FB 110 comprises an operational amplifier comprising an output 112, a first input 108, a second input 106 fed back from output 112, and a rotation control 144. According to another aspect, SB 120 comprises an operational amplifier comprising an output 122, a first input 118, a second input 116 fed back from output 122, and a rotation control 146. In an embodiment, feedback loops 106 and 116 are connected to the negative terminals of operational amplifiers of FB 110 and SB 120, respectively. In this way negative feedback loops 106 and 116 are formed. Accordingly, output 112 is based at least in part on input 108, feedback loop 106, and rotation control 144. Additionally, output 122 is based at least in part on input 118, feedback loop 116, and rotation control 146. In an embodiment, output 112 and output 122 respectively comprise a first offset (not shown) and a second offset (not shown). According to an aspect, rotation control 144 and rotation control 146 rotate a polarity of the first offset and the second offset, respectively. According to another aspect, rotation control 144 and rotation control 146 are configured to respectively rotate a polarity of the FB 110 and SB 120 based at least in part on an output of the chopper control module 240, such as offset rotate 142. For example, if the first input 108 of the FB 110 is Vrp and the first offset is Vos1, rotation control 144 facilitates rotation of a polarity of the first offset. In this example, if rotation control 144 is logic high, output 112 is Vrp+Vos1. Conversely, if rotation control 144 is logic low, output 112 is Vrp−Vos1. Similarly for the SB 120, if the first input 118 is Vrn and the second offset is Vos2, rotation control 146 facilitates rotation of a polarity of the second offset such that output 122 is Vrn+Vos2 when rotation control 146 is logic high and such that output 122 is Vrn−Vos2 when rotation control 146 is logic low.

In an embodiment, output 112 and output 122 of the FB 110 and the SB 120 are connected to a first input and a second input of the ADC 130, respectively. In an embodiment, ADC 130 is an over-sampling sigma-delta ADC and comprises an integrator, a quantizer, and is connected to an input voltage 210. According to an aspect, ADC 130 generates an output "D" 132 based at least in part on the outputs 112 and 122 of the FB and SB, respectively. Moreover, output "D" 132 comprises a reference voltage, the first offset, and the second offset. For example, the reference voltage is calculated by subtracting the output 122 of the SB from the output 112 of the FB. However, the ADC 130 is configured to rotate a polarity of the reference voltage based at least in part on the output "D" 132 of the ADC. Since the reference voltage is a function of output 112 and output 122, and the respective outputs comprise the first offset and second offset, respectively, a polarity of the first and second offsets is rotated when the polarity of the reference voltage is rotated. In an example, if the output "D" 132 is logical low, the polarity of the reference voltage is reversed such that the reference voltage is multiplied by negative one. In this example, if the output "D" 132 is logical high, the polarity of the reference voltage is maintained such that the reference voltage is multiplied by one.

In an embodiment, chopper control module 240 comprises an XNOR gate comprising a first input 134 connected to output "D" 132 of the ADC 130 and a second input connected to a reference clock 150. In an embodiment, chopper control module 240 decodes the first and second inputs to generate an offset rotate 142 based at least in part on the output "D" 132 of the ADC and the reference clock 150. In an aspect, the chopper control module 240 is configured to predetermine the output "D" 132 of the ADC and synchronize rotation between the chop-able buffers and the ADC 130.

It will be appreciated that the offset rotate 142 is connected to rotation control 144 and rotation control 146, thus enabling chopper control module 240 to control offset polarity rotation associated with the FB 110 and the SB 120. Additionally, it will be appreciated that chopper control module 240 also controls polarity rotation associated with the ADC 130 via a feedback loop from the output "D" 132 of the ADC 130, to the chopper control module 240, through at least one of the FB 110 or the SB 120, and back through the ADC 130. This feedback loop enables control of the polarity rotation associated with the reference voltage of the ADC at least because the reference voltage polarity rotation is based at least in part on the output "D" 132 of the ADC, which is fed into the chopper control module 240 at 134. Therefore, chopper control module 240 is configured to "synchronize" offset rotation effects from chop-able buffers 110, 120, and the ADC 130 via offset rotate 142. In an embodiment, offset rotate 142 enables the ADC to generate the output "D" 132 such that the output "D" 132 comprises a modulated ADC offset.

In an embodiment, digital low-pass filter 260 is connected to the output "D" 132 of the ADC and filters the modulated ADC offset from the output "D" 132 of the ADC to provide a desired output signal 262. According to an aspect, digital low-pass filter 260 is associated with a first frequency range such that signals within the first frequency range pass through the digital low-pass filter 260 and signals that fall outside the first frequency range do not pass through the digital low-pass filter 260. In an embodiment, the reference clock 150 comprises a second frequency that falls outside of the first frequency range. For example, the reference clock 150 is a high frequency reference clock configured to provide a clock signal to modulate offsets such that the modulated offsets are filtered by the digital low-pass filter 260. In an embodiment, the high frequency reference clock 150 comprises a clock frequency of 100 kHz to 10 MHz and the digital low-pass filter 260 filters signals such as the modulated offsets when the signals comprise a frequency above 1 kHz to 100 kHz, for example. In this way, buffer offset modulation or buffer offset cancelling is provided.

Figure 3:
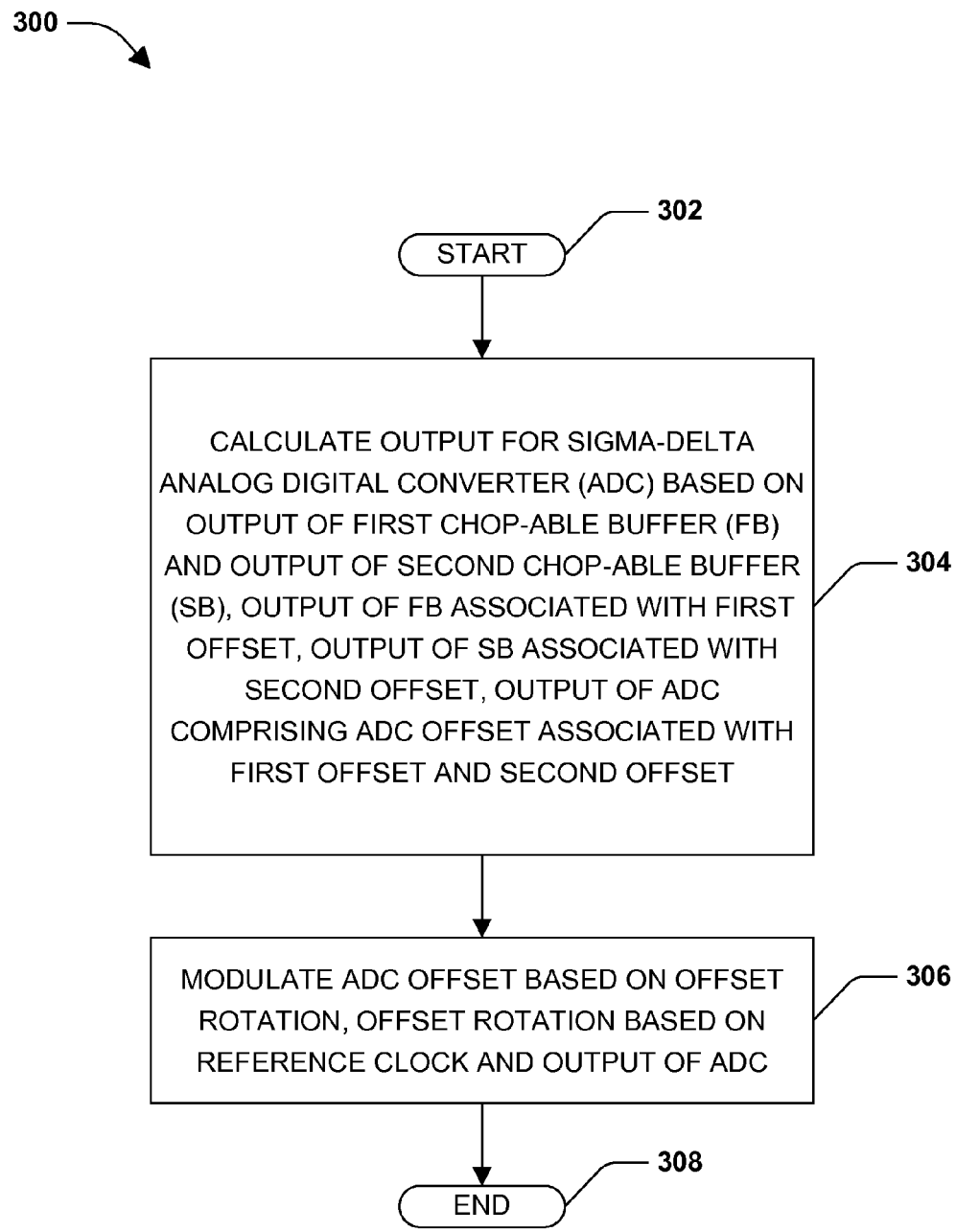
FIG. 3 is a flow diagram of an example method for buffer offset modulation, according to an embodiment.

FIG. 3 is a flow diagram of an example method 300 for buffer offset modulation, according to an embodiment. At 302, the method 300 starts, and at 304 an output for a sigma-delta analog digital converter (ADC), such as the ADC 130 of FIG. 1, for example, is calculated, based at least in part on an output of a first chop-able buffer (FB) and an output of a second chop-able buffer (SB), the output of the FB associated with a first offset, the output of the SB associated with a second offset, the output of the ADC comprising an ADC offset associated with or a function of the first offset and the second offset. In an embodiment, the output of the FB is fed back to a negative input of the FB to form a first feedback loop. Similarly, in an embodiment, the output of the SB is fed back to a negative input of the SB to form a second feedback loop.

At 306, the ADC offset is modulated, based at least in part on an offset rotation, the offset rotation based at least in part on a reference clock and the output of the ADC. In an embodiment, the modulated ADC offset is filtered from the output of the ADC using a low-pass filter. In an embodiment, the offset rotation is generated by an XNOR gate comprising a first input connected to the reference clock and a second input connected to the output of the ADC. In an embodiment, the offset rotation is generated at the output of the XNOR gate. For example, the offset rotation is connected to at least one of a rotation control of the FB or a rotation control of the SB.

In an embodiment, a frequency of the ADC offset modulation is based at least in part on a frequency of the reference clock. Accordingly, the frequency of the reference clock is based at least in part on a filter type associated with filtering the modulated ADC offset. For example, if the filter type is a low-pass filter, the reference clock comprises a high frequency. That is, for example, a low-pass filter is associated with a first frequency, such as a first frequency range for allowing low frequency signals within the first frequency range to pass through the low-pass filter. Therefore, the high frequency of the reference clock is greater than frequencies associated with the first frequency range. Conversely, if the filter type is a high-pass filter, the reference clock comprises a low frequency. For example, a high-pass filter is associated with a second frequency, such as a frequency range for allowing high frequency signals within the frequency range to pass through the high-pass filter. Therefore, the low frequency of the reference clock is less than frequencies associated with the frequency range. In an example, if the filter type is a band-pass filter associated with a third frequency range for allowing signals within the third frequency range through the band-pass filter, the reference clock comprises a non-band-pass frequency or a frequency not within the third frequency range.

Figures 4A, 4B:
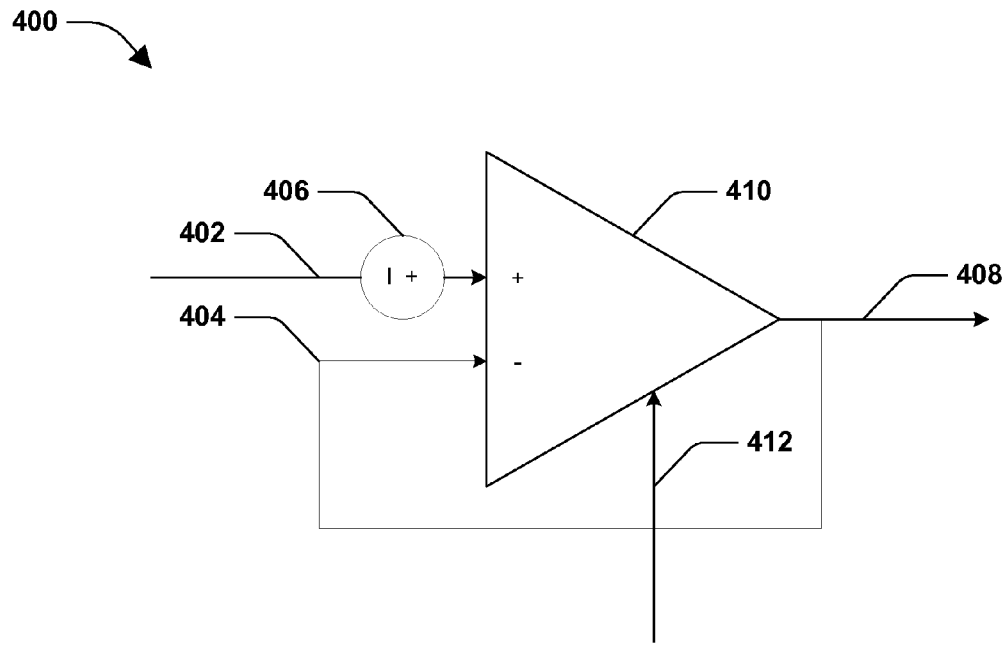
FIG. 4A is schematic diagram of an example chop-able reference buffer, according to an embodiment.
FIG. 4B is a truth table associated with an example chop-able reference buffer, according to an embodiment.

FIG. 4A is schematic diagram of an example chop-able reference buffer 400, according to an embodiment. In an example, chop-able reference buffer 400 corresponds to at least one of the first chop-able buffer (FB) 110 or the second chop-able buffer (SB) 120 of FIG. 2. In an embodiment, chop-able reference buffer 400 is a chop-able buffer comprising an operational amplifier 410. In an example, the operational amplifier 410 comprises a first input 402, a second input 404, an output 408 fed back to the second input 404 to form a feedback loop. Additionally, the output 408 is determined or calculated based on the first input 402 and an offset 406. In an embodiment, the output 408 is the first input 402−the offset 406. In another embodiment, the output 408 is the first input 402+the offset 406. The chop-able buffer 400 controls or rotates a polarity of the offset 406 based at least in part on rotation control 412 as is described further with regard to FIG. 4B. FIG. 4B is a truth table associated with an example chop-able reference buffer, according to an embodiment. For example, when an input voltage "Vin" is applied at the first input 402 and the offset voltage 406 for the chop-able buffer is "Vos", the output 408 is based on the rotation control 412. According to an example, if rotation control 412 is "0" or logical low, the output 408 of the chop-able buffer is "Vin−Vos". On the other hand, if rotation control 412 is "1" or logical high, the output 408 is "Vin+Vos".

Figures 5A, 5B:
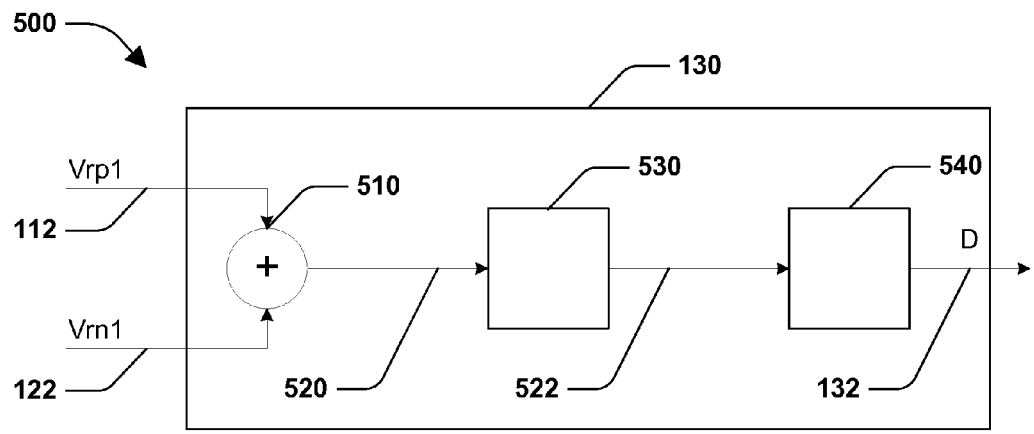
FIG. 5A is schematic diagram of an example sigma-delta analog digital converter (ADC), according to an embodiment.
FIG. 5B is a truth table associated with an example sigma-delta analog digital converter (ADC), according to an embodiment.

FIG. 5A is schematic diagram 500 of an example sigma-delta analog digital converter (ADC) 130, according to an embodiment. In an embodiment, the ADC 130 comprises a first input 112, a second input 122, a reference voltage component 510, a quantizer component 530, a polarity rotation component 540, and an output "D" 132. In an embodiment, the first input 112 corresponds to the output of the FB 110 of FIG. 2 and the second input 122 corresponds to the output of the SB 120 of FIG. 2. Further, the reference voltage component 510 is configured to generate a reference voltage 520 based at least in part on the first input 112 and the second input 122. For example, the reference voltage 520 is calculated by subtracting the second input 122 from the first input 112. In an example, the first input 112 is Vrp1, the second input 122 is Vrn1, and the reference voltage 520 is the first input 112 Vrp1−the second input 122 Vrn1. In an embodiment, there is no voltage drop or voltage increase across the quantizer component 530, such that reference voltage 520 effectively passes through the quantizer component 530. Accordingly, the voltage input to the quantizer component 530 corresponds to the reference voltage 520 and the voltage output from the quantizer component 530 also corresponds to the same reference voltage, such as reference voltage 522. In an embodiment, the output of the quantizer component 530 is reference voltage 522, which is equal to reference voltage 520, which is the input of quantizer component 530. In an embodiment, the quantizer component 530 comprises a comparator that is configured to compare the first input 112 and the second input 122 by analyzing a difference between the first input 112 and the second input 122 based on reference voltage 520, for example. In an embodiment, the polarity rotation component 540 is configured to facilitate rotation of a polarity of reference voltage 522 based at least in part on the output "D" 132 of the ADC, which is applied via a feedback loop not depicted in FIG. 5A, but is illustrated in FIG. 1 or FIG. 2, for example. FIG. 5B is a truth table associated with an example sigma-delta analog digital converter (ADC) 130, such as the ADC of FIG. 5A, according to an embodiment. Additionally, the truth table of FIG. 5B explains logic associated with the polarity rotation component 540 and how a change in polarity 590 for reference voltage 522 is determined. For example, in an embodiment, the output of the FB 110 is Vrp1 112 and the output of the SB 120 is Vrn1 122, and the reference voltage 520 generated by the reference voltage component 510 is Vrp1−Vrn1=(Vrp1−Vrn1)=+(Vrp1−Vrn1), as illustrated at column 586 of the truth table in FIG. 5B. However, polarity rotation component 540 is configured to rotate a polarity of the reference voltage 520 based on a feedback look comprising the output "D" 132 of the ADC, such as the feedback loop of FIG. 1 or FIG. 2. In an embodiment, polarity rotation component 540 is configured to multiply the reference voltage 522 by "−1" based at least in part on the output "D" 132 being logical low or D=0, such as illustrated in row 570 and column 584. In an embodiment, the polarity rotation component 540 rotates or changes the polarity of the reference voltage 522 to +(Vrp1−Vrn1)*−1=−(Vrp1−Vrn1) to provide a reference voltage at the output D 132, as illustrated in row 570 and column 588. Therefore, when output "D" 132 is a logical low or D=0 according to row 570, the polarity rotation component 540 changes the polarity of reference voltage 522 by multiplying reference voltage 522 by negative one, resulting in a "Yes" change to the polarity at row 570 and column 590.

In another example, the output of the FB 110 is Vrp1 112 and the output of the SB 120 is Vrn1 122, and the reference voltage 520 generated by the reference voltage component 510 is Vrp1−Vrn1=(Vrp1−Vrn1)=+(Vrp1−Vrn1), as illustrated at column 586 of the truth table in FIG. 5B. In an embodiment, polarity rotation component 540 is configured to rotate a polarity of the reference voltage 520 based on a feedback loop comprising the output "D" 132 of the ADC, such as the feedback loop of FIG. 1 or FIG. 2. In an embodiment, polarity rotation component 540 is configured to multiply the reference voltage 522 by "+1" based at least in part on the output "D" 132 being logical high or D=1, such as illustrated in row 580 and column 584. In an embodiment, the polarity rotation component 540 maintains the polarity of the reference voltage 522 by multiplying reference voltage 522 by "+1". For example, +(Vrp1−Vrn1)*+1=+(Vrp1−Vrn1). Therefore, the reference voltage at the output "D" 132 is +(Vrp1−Vrn1), as illustrated by row 580 and column 588. Therefore, when output "D" 132 is a logical high or D=1 according to row 580, the polarity rotation component 540 does not change a polarity of a reference voltage at 132, resulting in "No" change to the polarity at row 580 and column 590.

FIG. 6 is a truth table 600 associated with an example of buffer offset modulation, such as at output 132 of ADC 130 in FIG. 2, for example, according to an embodiment. In an embodiment, FIG. 6 is described with respect to at least some components or reference numerals of FIG. 2. In an example embodiment, Vrp is an input 108 for a first chop-able buffer (FB) 110, Vrn is an input 118 for a second chop-able buffer (SB) 120, Vos1 is an offset associated with the output 112 of the FB 110, Vos2 is an offset associated with the output 122 of the SB 120, Vrp1 is the output 112 of the FB 110, and Vrn1 is the output 122 of the SB 120. It will be appreciated that Vrp1 112 and Vrn1 122 change based on offset rotate 142 at least because the offset rotate 142, as listed in table 600, is connected to rotation control 144 of FB 110 and rotation control 146 of SB 120.

For example, in rows 610 and 630, if offset rotate 142 (R)="0" or is logical low, the output 112 for the FB 110, Vrp1=Vrp−Vos1.

Additionally, in rows 610 and 630, if offset rotate 142="0" or is logical low, the output 122 for the SB 120, Vrn1=Vrn−Vos2.

In another example, in rows 620 and 640, if offset rotate 142="1" or is logical high, the output 112 for the FB 110, Vrp1=Vrp+Vos1.

Similarly, in rows 620 and 640, if offset rotate 142="1" or is logical high, the output 122 for the SB 120, Vrn1=Vrn+Vos2.

Accordingly, since the reference voltage 520 for the ADC 130 is Vrp1−Vrn1, the reference voltage 520=(Vrp−Vrn)−(Vos1−Vos2) for rows 610 and 630 when offset rotate 142="0" or is logical low. In an aspect, the reference voltage 520=(Vrp−Vrn)+(Vos1−Vos2) for rows 620 and 640 when offset rotate 142="1" or is logical high.

In an embodiment, the ADC 130 rotates a polarity of the reference voltage 522 based at least in part on an output "D" 132 of the ADC 130. In an embodiment, when output "D" 132 of the ADC is logical low or D=0, the polarity of the reference voltage 522 is rotated or multiplied by "−1".

Therefore, in an example, in row 610, when offset rotate 142="0" and the output "D" 132="0", the output 132=(Vrn−Vrp)+(Vos1−Vos2). Accordingly, a reference voltage at output "D" 132 is (Vrn−Vrp) and an ADC offset at the output "D" 132 is +(Vos1−Vos2).

In an example, in row 620, when offset rotate 142="1" and the output "D" 132="0", the output 132=(Vrn−Vrp)−(Vos1−Vos2). Accordingly, a reference voltage at output "D" 132 is (Vrn−Vrp) and an ADC offset at the output "D" 132 is −(Vos1−Vos2).

In an example, in row 630, when offset rotate 142="0" and the output "D" 132="1", the output 132=(Vrp−Vrn)−(Vos1−Vos2). Accordingly, a reference voltage at output "D" 132 is (Vrp−Vrn) and an ADC offset at the output "D" 132 is −(Vos1−Vos2).

In an example, in row 640, when offset rotate 142="1" and the output "D" 132="1", the output at 132=(Vrp−Vrn)+(Vos1−Vos2). Accordingly, a reference voltage at output "D" 132 is (Vrp−Vrn) and an ADC offset at the output "D" 132 is +(Vos1−Vos2).

Figure 7:
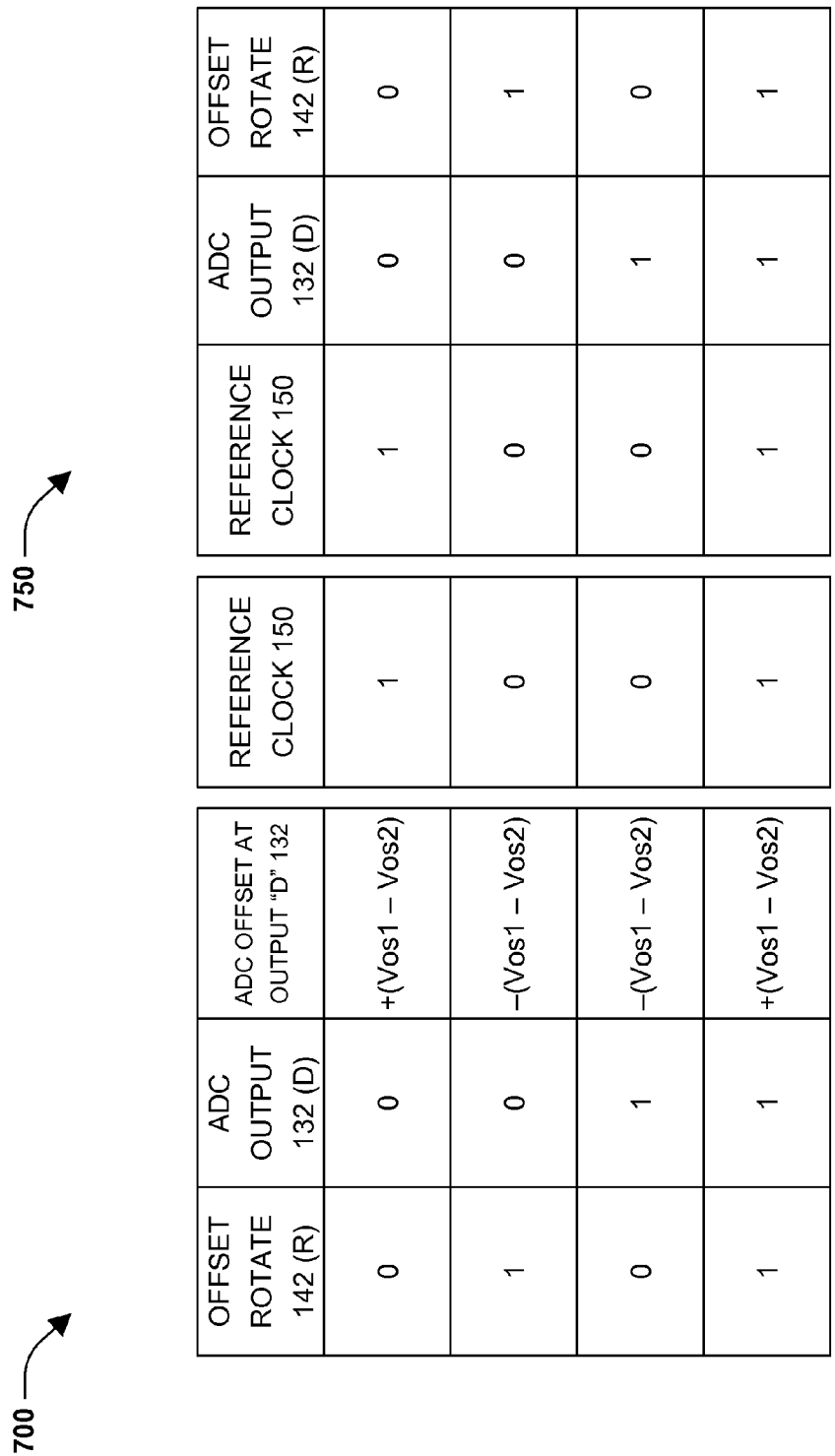
FIG. 7 is a truth table associated with an example of buffer offset modulation, according to an embodiment.

Examining the offset portion of the aforementioned reference voltages 520 and 522 enables calculation of an embodiment. For example, FIG. 7 is a truth table 700 associated with an example of buffer offset modulation, according to an embodiment associated with FIG. 2 and FIG. 6. If offset rotate 142 is "R" and an output 132 of the ADC 130 is "D", and an ADC offset at the ADC output "D" 132 is at least one of +(Vos1−Vos2) or −(Vos1−Vos2), it will be appreciated that truth table 700 is formed.

If R=0 and D=0, the ADC offset=+(Vos1−Vos2).
If R=1 and D=0, the ADC offset=−(Vos1−Vos2).
If R=0 and D=1, the ADC offset=−(Vos1−Vos2).
If R=1 and D=1, the ADC offset=+(Vos1−Vos2).

In an embodiment a reference clock 150 is associated with the ADC offset at output "D" 132 such that "0" for the reference clock 150 is associated with −(Vos1−Vos2) and "1" is associated with +(Vos1−Vos2). By rearranging the reference clock 150 column and the ADC output 132 columns to be inputs, a new truth table 750 is formed to determine offset rotate 142 (R), for example. Table 750 is a truth table associated with an example of buffer offset modulation, according to an embodiment. In an embodiment, chopper control module 140 of FIG. 2 implements logic based at least in part on table 750. In this embodiment, the chopper control module 140 is an XNOR gate based at least in part on the logic of table 750.

Figure 8:
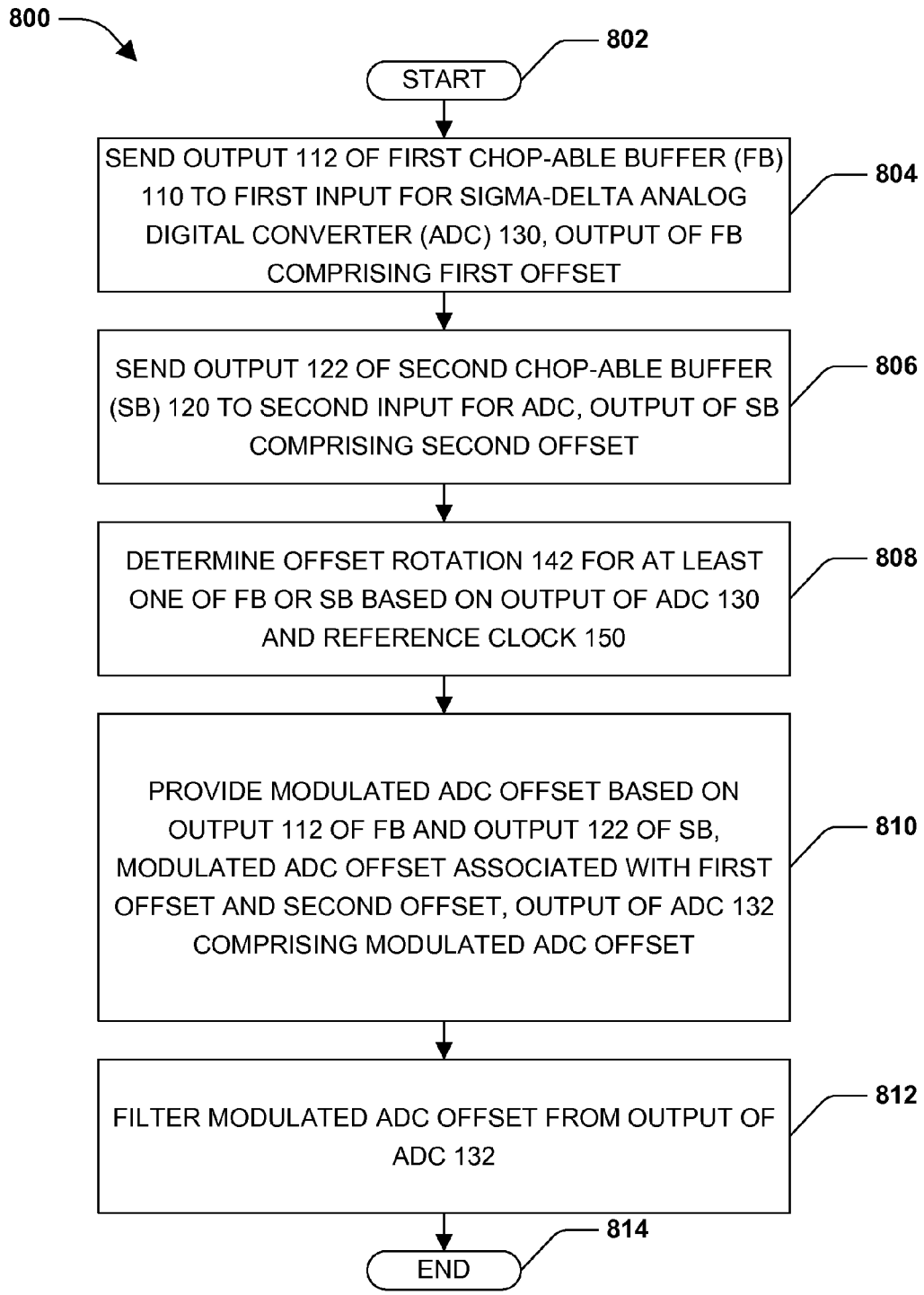
FIG. 8 is a flow diagram of an example method for buffer offset modulation, according to an embodiment.

FIG. 8 is a flow diagram of an example method 800 for buffer offset modulation, according to an embodiment. For example, example method 800 is related to the schematic diagram of FIG. 2. At 802 the method 800 begins, and at 804 an output 112 of a first chop-able buffer (FB) 110 is connected to a first input for a sigma-delta analog digital converter (ADC) 130. In an embodiment, the output of the FB 112 comprises a first offset. At 806, an output 122 of a second chop-able buffer (SB) 122 is connected to a second input for the ADC 130. In an embodiment, the output of the SB 122 comprises a second offset. At 808, an offset rotation 142 is generated for at least one of the FB 110 or the SB 120 based at least in part on an output 132 of the ADC 130 and a reference clock 150. At 810, a modulated ADC offset is provided, based at least in part on the output 112 of the FB 110 and the output 122 of the SB 120. In an embodiment, the modulated ADC offset is associated with the first offset and the second offset and the output of the ADC comprises the modulated ADC offset. At 812, the modulated ADC offset is filtered from the output 132 of the ADC 130.

According to an aspect, a method for buffer offset modulation is provided, comprising calculating an output for a sigma-delta analog digital converter (ADC) based at least in part on an output of a first chop-able buffer (FB) and an output of a second chop-able buffer (SB), the output of the FB associated with a first offset, the output of the SB associated with a second offset, the output of the ADC comprising an ADC offset associated with the first offset and the second offset. The method also comprises modulating the ADC offset based at least in part on an offset rotation, the offset rotation based at least in part on a reference clock and the output of the ADC.

According to an aspect, a circuit for buffer offset modulation is provided, comprising a first chop-able buffer (FB) comprising an input, a rotation control, and an output, the output of the FB associated with a first offset, the output of the FB based at least in part on the input of the FB and the rotation control of the FB. The circuit comprises a second chop-able buffer (SB) comprising an input, a rotation control, and an output, the output of the SB associated with a second offset, the output of the SB based at least in part on the input of the SB and the rotation control of the SB. The circuit comprises a sigma-delta analog digital converter (ADC) comprising a first input, a second input, and an output comprising an ADC offset associated with the first offset and the second offset, the first input of the ADC connected to the output of the FB, the second input of the ADC connected to the output of the SB. The circuit comprises a chopper control module comprising a first input, a second input, and an output, the first input of the chopper control module connected to a reference clock, the second input of the chopper control module connected to the output of the ADC, the output of the chopper control module configured to control the rotation control of the FB and the rotation control of the SB, the ADC configured to modulate the ADC offset based at least in part on the output of the FB and the output of the SB.

According to an aspect, a method for buffer offset modulation is provided, comprising sending an output of a first chop-able buffer (FB) to a first input for a sigma-delta analog digital converter (ADC), the output of the FB comprising a first offset. The method comprises sending an output of a second chop-able buffer (SB) to a second input for the ADC, the output of the SB comprising a second offset. The method comprises determining an offset rotation for at least one of the FB or the SB based at least in part on an output of the ADC and a reference clock. The method comprises providing a modulated ADC offset based at least in part on the output of the FB and the output of the SB, the modulated ADC offset associated with the first offset and the second offset, the output of the ADC comprising the modulated ADC offset, and filtering the modulated ADC offset from the output of the ADC.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A method for buffer offset modulation, comprising:
    calculating an output for a sigma-delta analog digital converter (ADC) based at least in part on an output of a first chop-able buffer (FB) and an output of a second chop-able buffer (SB), the output of the FB associated with a first offset, the output of the SB associated with a second offset, the output of the ADC comprising an ADC offset associated with the first offset and the second offset; and
    modulating the ADC offset based at least in part on an offset rotation, the offset rotation based at least in part on a reference clock and the output of the ADC.

2. The method of claim 1, comprising filtering the modulated ADC offset from the output of the ADC.

3. The method of claim 1, comprising determining the offset rotation comprising:
    sending the reference clock to a first input of an XNOR gate;
    sending the output of the ADC to a second input of the XNOR gate; and
    determining the offset rotation at an output of the XNOR gate and sending the offset rotation to at least one of a rotation control of the FB or a rotation control of the SB.

4. The method of claim 1, comprising adjusting a frequency of the reference clock based at least in part on a filter type for filtering the modulated ADC offset.

5. The method of claim 1, comprising:
    filtering the modulated ADC offset from the output of the ADC using a filter associated with a first frequency; and
    determining the offset rotation based at least in part on a reference clock associated with a second frequency greater than the first frequency.

6. The method of claim 1, comprising:
    filtering the modulated ADC offset from the output of the ADC using a filter associated with a first frequency; and
    determining the offset rotation based at least in part on a reference clock associated with a second frequency less than the first frequency.

7. The method of claim 1, comprising forming a first feedback loop from the output of the FB to an input of the FB.

8. The method of claim 1, comprising forming a second feedback loop from the output of the SB to an input of the SB.

9. The method of claim 1, comprising:
filtering the modulated ADC offset from the output of the ADC using a filter associated with a band-pass frequency; and
determining the offset rotation based at least in part on a reference clock frequency associated with the reference clock.

10. The method of claim 1, comprising providing an input voltage for the ADC.

11. A circuit for buffer offset modulation, comprising:
a first chop-able buffer (FB) comprising an input, a rotation control, and an output, the output of the FB associated with a first offset, the output of the FB based at least in part on the input of the FB and the rotation control of the FB;
a second chop-able buffer (SB) comprising an input, a rotation control, and an output, the output of the SB associated with a second offset, the output of the SB based at least in part on the input of the SB and the rotation control of the SB;
a sigma-delta analog digital converter (ADC) comprising a first input, a second input, and an output comprising an ADC offset associated with the first offset and the second offset, the first input of the ADC connected to the output of the FB, the second input of the ADC connected to the output of the SB; and
a chopper control module comprising a first input, a second input, and an output, the first input of the chopper control module connected to a reference clock, the second input of the chopper control module connected to the output of the ADC, the output of the chopper control module configured to control the rotation control of the FB and the rotation control of the SB, the ADC configured to modulate the ADC offset based at least in part on the output of the FB and the output of the SB.

12. The buffer offset modulation circuit of claim 11, the FB configured to rotate a polarity of the first offset based at least in part on the output of the chopper control module.

13. The buffer offset modulation circuit of claim 11, the SB configured to rotate a polarity of the second offset based at least in part on the output of the chopper control module.

14. The buffer offset modulation circuit of claim 11, the ADC configured to rotate a polarity of the ADC offset based at least in part on the output of the ADC.

15. The buffer offset modulation circuit of claim 11, comprising a filter configured to filter the ADC offset from the output of the ADC.

16. The buffer offset modulation circuit of claim 15, the filter comprising at least one of a first filter associated with a first frequency, a second filter associated with a second frequency, or a third filter associated with a third frequency range.

17. The buffer offset modulation circuit of claim 11, the ADC comprising a polarity rotation component configured to determine the output of the ADC based at least in part on the output of the FB and the output of the SB.

18. The buffer offset modulation circuit of claim 11, the chopper control module comprising an XNOR gate configured to correspond to the first input of the chopper control module, the second input of the chopper control module, and the output of the chopper control module.

19. The buffer offset modulation circuit of claim 11, the ADC comprising a comparator.

20. A method for buffer offset modulation, comprising:
sending an output of a first chop-able buffer (FB) to a first input for a sigma-delta analog digital converter (ADC), the output of the FB comprising a first offset;
sending an output of a second chop-able buffer (SB) to a second input for the ADC, the output of the SB comprising a second offset;
determining an offset rotation for at least one of the FB or the SB based at least in part on an output of the ADC and a reference clock;
providing a modulated ADC offset based at least in part on the output of the FB and the output of the SB, the modulated ADC offset associated with the first offset and the second offset, the output of the ADC comprising the modulated ADC offset; and
filtering the modulated ADC offset from the output of the ADC.

* * * * *